United States Patent

Uesugi et al.

[11] Patent Number: 6,042,650
[45] Date of Patent: Mar. 28, 2000

[54] PROCESSING APPARATUS FOR FABRICATING LSI WITH PROTECTED BEAM DAMPER

[75] Inventors: Fumihiko Uesugi; Natsuko Ito, both of Tokyo, Japan

[73] Assignee: NEC Corporation, Tokyo, Japan

[21] Appl. No.: 09/070,750

[22] Filed: May 1, 1998

[30] Foreign Application Priority Data

May 1, 1997 [JP] Japan ................................ 9-113949

[51] Int. Cl.⁷ .................................................. B05C 11/00
[52] U.S. Cl. ........................................... 118/712; 118/715
[58] Field of Search .................................... 118/715, 724, 118/725, 712, 713; 204/298.03, 298.07, 298.11

[56] References Cited

U.S. PATENT DOCUMENTS 4,919,077  4/1990  Oda et al. ......................... 118/723 MP

FOREIGN PATENT DOCUMENTS

| 61-73332 | 4/1986 | Japan . |
| 63-36532 | 2/1988 | Japan . |
| 63-143264 | 6/1988 | Japan . |
| 4-68521 | 3/1992 | Japan . |
| 4-221078 | 8/1992 | Japan . |
| 6-069172 | 3/1994 | Japan . |
| 6-216041 | 8/1994 | Japan . |

OTHER PUBLICATIONS

Tadao Tsuruta, "Pencil of Rays", New Technology Communications, 1984, pp. 296–306 (no month date).

Primary Examiner—Katherine A. Bareford
Attorney, Agent, or Firm—Young & Thompson

[57] ABSTRACT

A part of the outer wall of the processing chamber supplied with an active gas for an intended processing forms a protruding section extending out from the outer wall into the air. An incident side window through which laser light is guided is mounted to the protruding portion. A baffle is provided inside the protruding portion for intercepting unnecessary portion of light guided in the processing chamber even if irregularly reflecting light arises, when laser light is guided into the window. An antireflection coating is coated on the air side surface of the window. A purge gas inlet port for blowing out a purge gas along the inside surface of the window is formed in the protruding portion. Therefore, a deposit caused by a process gas on the chamber inside surface of an incident side window and the surface of a stopper for beam light is prevented from producing, thereby the inside of the chamber is not contaminated and weak scattered light from a fine particle floating or falling down in the chamber can be measured.

16 Claims, 6 Drawing Sheets

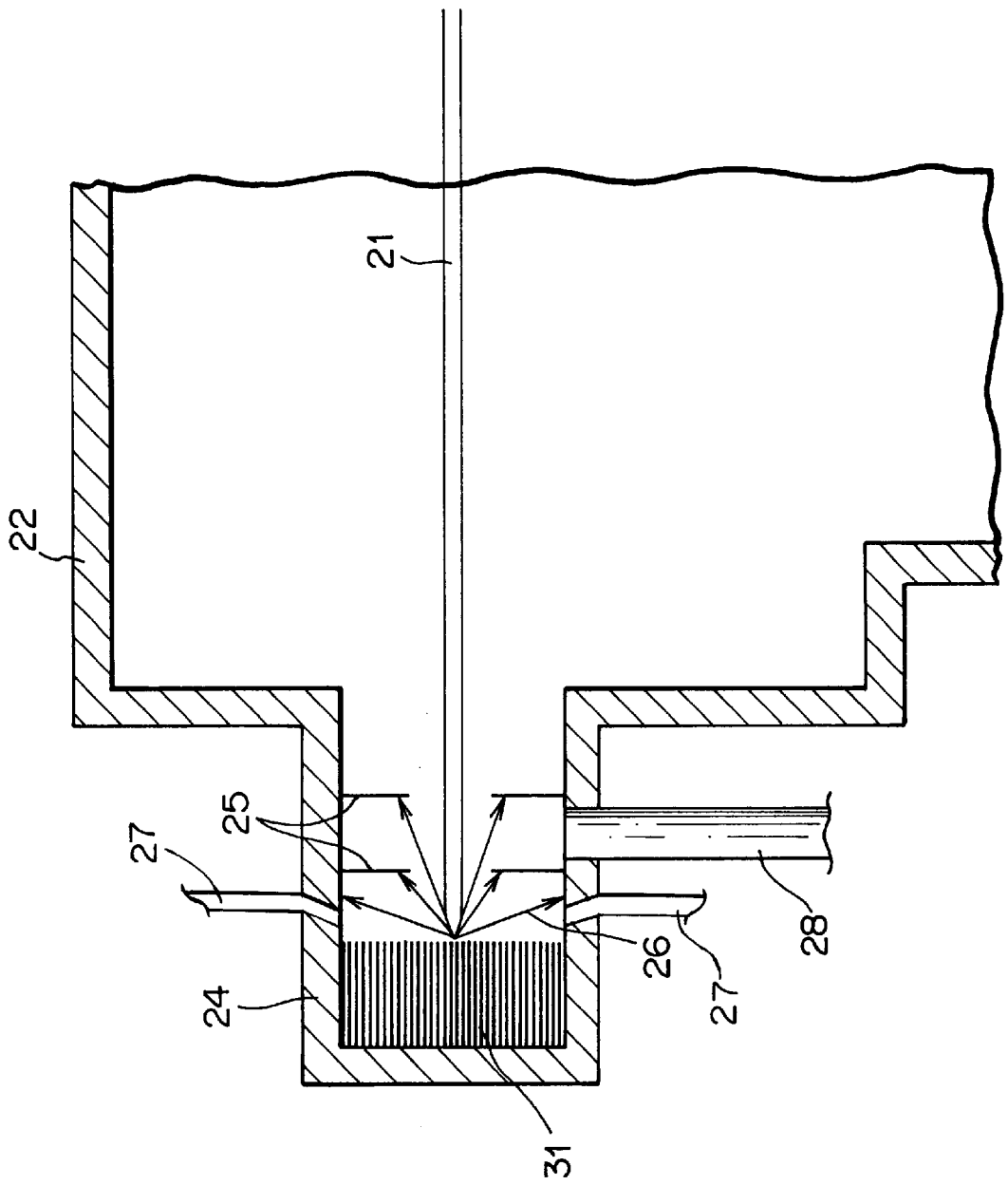

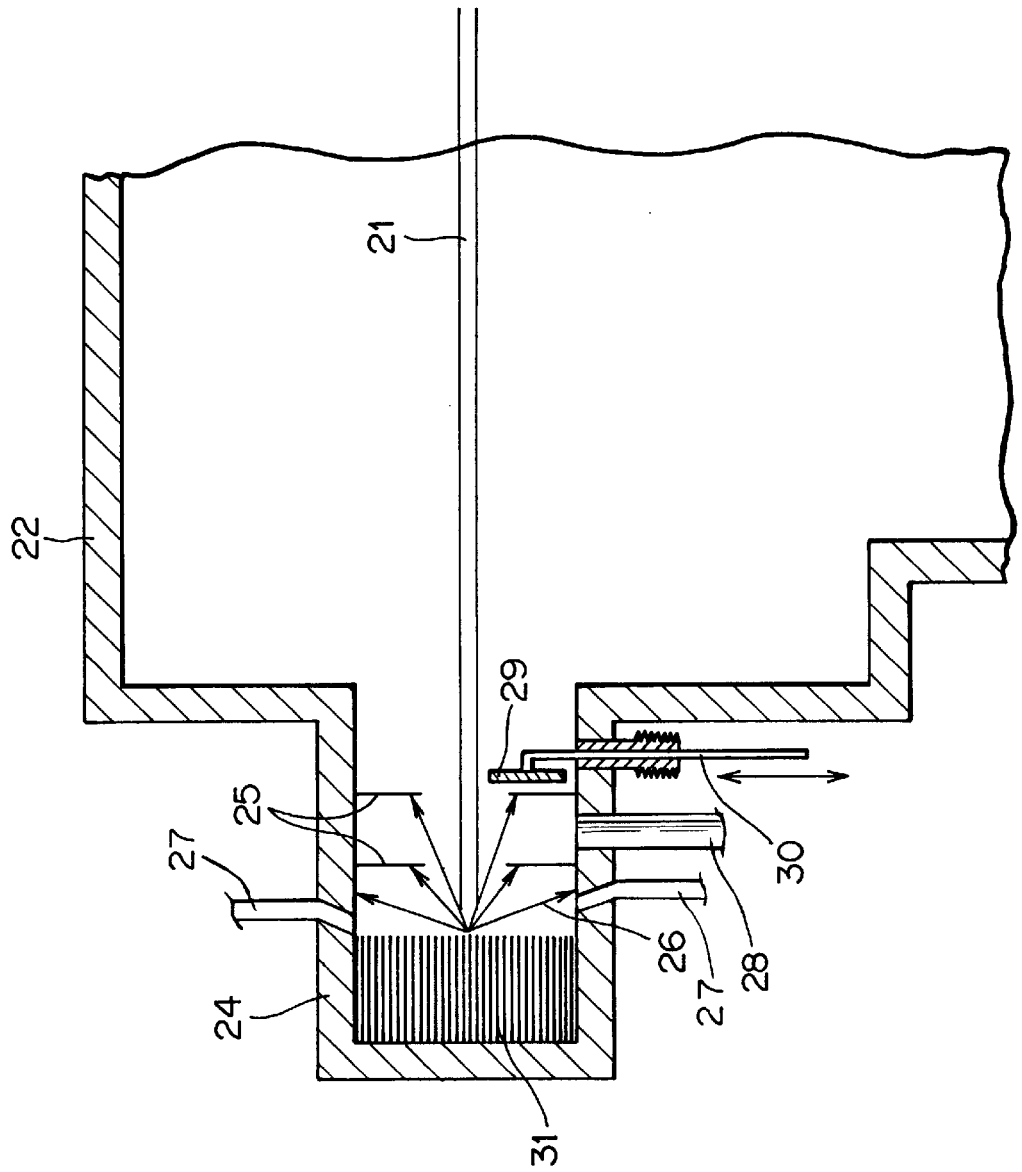

PROCESSING APPARATUS FOR FABRICATING LSI WITH PROTECTED BEAM DAMPER

BACKGROUND OF THE INVENTION

1. Technical Field of Invention

The present invention relates to a processing apparatus for fabricating LSI in which a predetermined gas is supplied into a chamber to conduct an intended processing on a substrate. More particularly, the present invention relates to a processing apparatus in which laser light is guided into a chamber from the outside of the chamber through a window of the chamber in order to observe an occurrence state of a fine particle which adversely affects the intended processing and measure scattered light from the fine particle floating in the chamber.

2. Related Art

When laser light is guided in a chamber through a window of the chamber and scattered light from a fine particle (for example, dust or dirt) in the chamber is measured by a variety of causes, stray light occurs other than the scattered light from the fine particle. The stray light comprises: reflecting light on front and rear surfaces of the window from the laser light, irregularly reflecting light on the inside wall of the apparatus, irregularly reflecting light on a stopper of the laser light, and the like. These other reflected lights are usually stronger than a weak fine particle scattered light. Therefore, in order to measure such weak scattered light from a fine particle, it is desirable to suppress the reflecting light and irregularly reflecting light. As a method to realize this, prior art has generally adopted, an antireflection coat applied on a window (hereinafter referred to as incident side window) through which laser light is guided in order to reduce a reflectance or a beam stopper made black in order to suppress irregularly reflecting light.

Alternatively, a method in which multiple reflection light of laser light by the incident side window or irregularly reflecting light from a light stopper for laser light is reduced includes beam damper called a baffle, a Rayleigh's horn or the like. In this regard, a summary is described in Tadao Tsuruta "light pencil" New Technology Communication Co. 1984; pp 296 to 306.

While the above mentioned methods are effective, two problems arise when for example, a chemically active gas (hereinafter referred as active gas) is supplied into a chamber and a film formation process is conducted on a semiconductor substrate by chemical reaction.

One is a problem that occurs on an incident side window of laser light. That is, since the chamber inside surface of the incident side window is exposed to an active gas, a reaction product deposits on the window due to a chemical reaction of the active gas with of the window material. As a result, scattered light is produced by the deposited product, which scattered lights hinders measurement on that essentially desired to be measured weak scattered light caused by a fine particle. Besides, an intensity of laser light to be guided into the chamber is reduced due to scattering by the deposited product and thereby an intensity of the weak scattered light from the fine particle is weaker, which makes measurement harder. When an intensity of laser light is strong, the deposited product is sometimes scattered to contaminate the inside of the chamber.

The other problem occurs on a stopper for laser light. When laser light is guided into the chamber, a beam damper is mounted on the inside wall of the chamber opposed to the incident side window as a stopper for the laser light. The damper is ideally fabricated with a 100% material light. Since a material has necessarily a reflectance which is not zero, however, a Rayleigh's horn or a bundle of razor's blades, as described in the above mentioned reference, is used to achieve a reflectance of close to zero by use of multiple reflections. In this case, since surface area is increased, there arises the same problem as on the chamber inside surface of the incident side window as has been mentioned. That is, light scattering on the damper surface is increased due to deposition of a reaction product or a deposited product on the damper surface is scattered around by strong laser light, which contaminates the inside of the chamber.

Thus, when weak scattered light from a fine particle in the chamber is measured in a processing apparatus in which a chemically active gas is used, it is insufficient only to use a baffle, a Rayleigh's horn or a bundle of razor's blades, which have conventionally been used. This is a problem as detecting a fine particles in a processing apparatus chamber is an important means to stabilize a processing condition of a substrate.

SUMMARY OF THE INVENTION

It is an object of the present invention to provide a processing apparatus for fabricating LSI in which deposition of a reaction product on the chamber inside surface of an incident side window and on a surface of a stopper for beam light caused by a gas for a processing of a substrate (a gas used in a process) is prevented, thereby the inside of the chamber is not contaminated and weak scattered light from a fine particle which is floating or falling down in the chamber can be measured.

In order to achieve the above mentioned object, the present invention provides a processing apparatus for fabricating LSI comprising a chamber having a light guide-in window; a means for supplying a chemically active gas into said chamber; and a gas blowing-out means for blowing out a gas which is chemically inert with a material of said light guide-in window to an inside surface of the light guide-in window, which is inside said chamber.

According to other aspect of the present invention, there is provided a processing apparatus for fabricating LSI comprising an exhausting means for exhausting said chemically active gas so that said gas may not reach a space in the vicinity of an inside surface of the light guide-in window, which is inside said chamber; or a shutter means for opening and closing an inlet port of said chemically active gas to an inside surface of the light guide-in window, which is inside said chamber.

According to still other aspect of the present invention, there is provided a processing apparatus for fabricating LSI comprising a chamber having a beam damper to decrease laser light guided in said chamber; means for supplying a chemically active gas into said chamber; and gas blowing-out means for blowing out a gas which is chemically inert with a material of said beam damper to said beam damper.

According to still other aspect of the present invention, there is provided a processing apparatus for fabricating LSI comprising an exhausting means for exhausting said chemically active gas so that said gas may not reach a space in the vicinity of said beam damper; or a shutter means for opening and closing an inlet port of said chemically active gas to said beam damper.

According to the present invention, a gas which is chemically inert with a material of a light guide-in window or a beam damper of a chamber which a Processing apparatus for fabricating LSI comprises is blown out to the inside surface of the light guide-in window or the beam damper by a gas blow-out structure. For that reason, in conducting an intended processing on a substrate by supplying a chemically active gas into the chamber, the active gas does not contact with the inside surface of the light guide-in window or the beam damper, so that deposition of a reaction product is prevented. As a result, in measurement of scattered light from a fine particle floating in the chamber by guiding-in laser light in the chamber through the light guide-in window, a weak scattered light from a fine particle in the chamber can be measured since irregularly reflecting light, which is unnecessary, does not arise on the inside surface of the light guide-in window or the beam damper. Beside, the inside of the chamber is not contaminated by scattering of the reaction product which strong laser light causes since there is no deposition of the reaction product on the inside surface of the light guide-in window or on the beam damper, even when an intensity of laser light is increased.

Equipped with an exhaust system for exhausting an environmental gas in the vicinity of the inside surface of the light guide-in window or the beam damper, a probability that a reaction product of the active gas deposits on the inside surface of the light guide-in window or the beam damper is reduced since a concentration of the active gas in the vicinity of the inside surface of the light guide-in window or the beam damper is reduced. As a result, in measurement of scattering light from a fine particle floating in the chamber by use of laser light guided into the chamber, weak scattering light from a fine particle in the chamber can be measured since no scattered reflecting light which is unnecessary arises on the inside surface of the light guide-in window or the beam damper.

Since a shutter mechanism for opening or closing an inlet port for a chemically active gas to the inside surface of the light guide-in window or the beam damper is provided, it is possible that the gas inlet port to the inside surface of the light guide-in window or the beam damper is opened only when laser light is guided in the chamber for measurement of scattered light from a fine particle in the chamber and is closed when laser light is not guided therein. Therefore, the inside surface of the light guide-in window or the beam damper is never exposed to the chemically active gas when exposure to the gas is unnecessary.

As described above, the present invention provides a processing apparatus for fabricating LSI comprising a window through which laser light is guided and a beam damper as a stopper for the laser light guided-in, wherein the apparatus further comprises a structure such that a chemically active gas for a predetermined processing which is supplied into the chamber does not reach the inside surface of the window and the beam damper. With such a structure, deposition of a reaction product on the inside surface of the window and the beam damper is prevented. Therefore, no irregularly reflecting light, which is unnecessary, is present on the inside surface of the window and the beam damper and weak scattered light from a fine particle occurring in the chamber can be measured.

BRIEF DESCRIPTION OF THE DRAWINGS

FIG. 5 is a partially sectional view showing a processing apparatus for fabricating LSI according to a fifth embodiment of the present invention; and FIG. 6 is a partially sectional view showing a processing apparatus for fabricating LSI according to a sixth embodiment of the present invention.

DETAILED DESCRIPTION OF THE PREFERRED EMBODIMENT

Description on embodiments of the present invention will be made in reference to the accompanying drawings below.
First Embodiment Here is described a processing apparatus for fabricating LSI comprising a chamber to which an active gas is supplied for an intended processing, the apparatus further comprising a gas passage structure for blowing a purge gas on the inside surface of a laser light guide-in window in order to prevent deposition of a reaction product on the inside surface of the laser light guide-in window.

Figure 1:
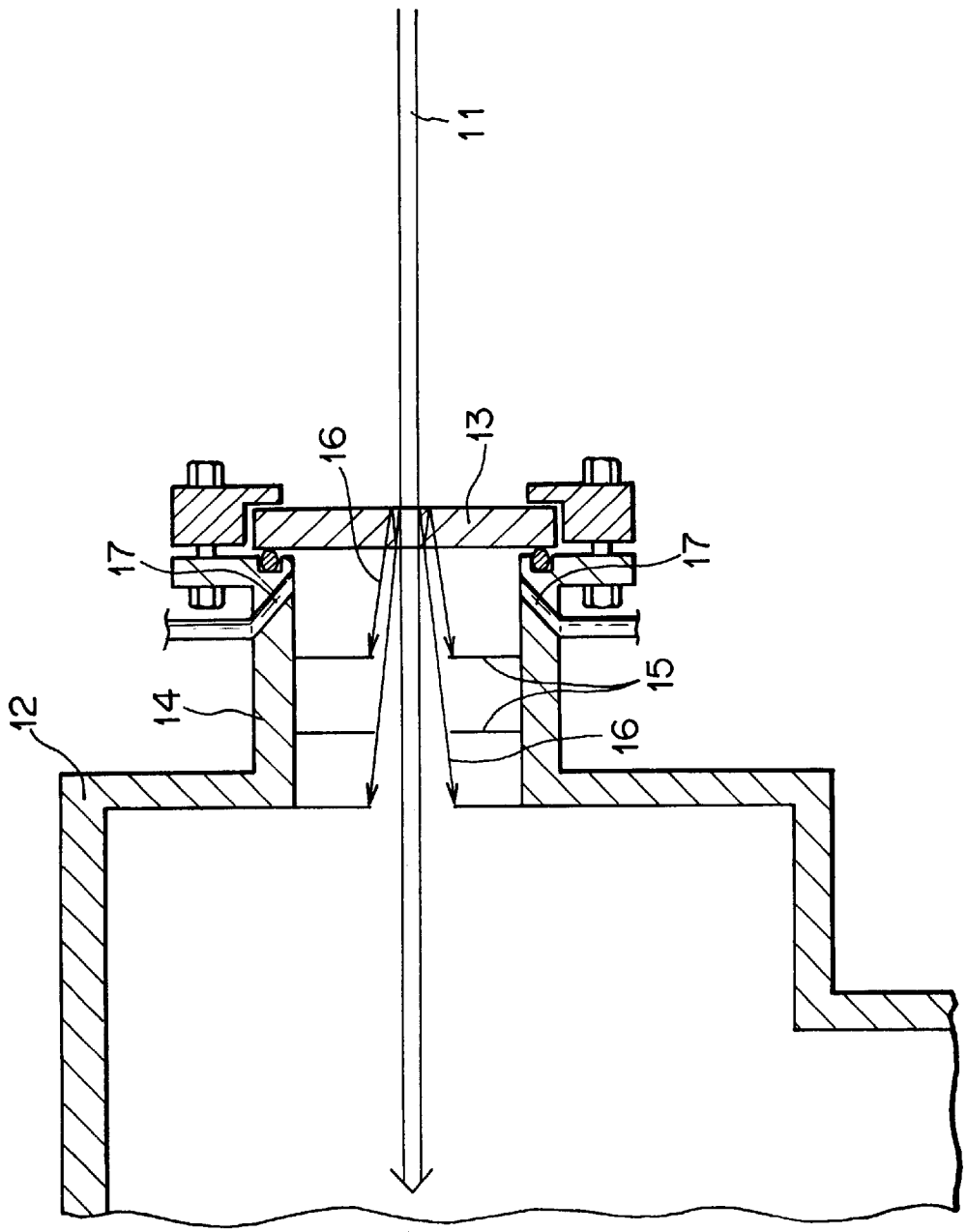
FIG. 1 is a partially sectional view showing a processing apparatus for fabricating LSI according to a first embodiment of the present invention.

FIG. 1 is a partially sectional view showing, in the best way, the first embodiment of a processing apparatus for fabricating LSI of the present invention.

As shown in FIG. 1, a processing apparatus for fabricating LSI of this embodiment comprises a process chamber 12 which is a chamber supplied with an active gas for an intended processing. A part of the outer wall of the process chamber 12 forms a protruding portion 14 extending out from the outer wall into the air. An incident side window (made of a light transmissive member such as glass) 13 through which laser light 11 is guided is mounted so as to seal an opening end of the protruding portion 14. A baffle 15 is provided inside the protruding portion 14 for intercepting unnecessary portions of light guided in the process chamber 12 if irregularly reflecting light 16 arises. An antireflection coating is coated on the air side surface of the window 13 for preventing reduction in laser light transmittance of the window 13. A purge gas inlet port 17, which is a gas passage structure, for blowing a purge gas along the inside surface of the window 13 is formed in the protruding portion 14 thereby. The protruding portion 14 has an effect of reducing the quantity of irregularly reflecting light 16 entering the chamber 12.

In such an apparatus, an active gas is present in the process chamber 12 at a predetermined pressure and the active gas intrudes into the side of the window 13 through a laser guide-in port of the baffle 15. However, since a purge gas such as chemically inert He or the like from the purge gas inlet port 17 is guided along the inside surface of the window 13, the purge gas covers the inside surface of the window 13 and sucked into the process chamber 12 by an exhaust system (not shown) of the process chamber 12. For that reason, it is difficult for the active gas to reach the window 13 and deposition of a product from a chemical reaction on the inside surface of the window 13 is prevented from occurring.

A purge gas mentioned above may be any gas which is chemically inert with the window material and in addition to He, a rare gas such as Ar as a first of the kind, $N_2$ gas or the like may be used. A flow rate of a purge gas may be determined by considering a pressure in the chamber, a partial pressure of an active gas and the like.

With such a structure whereby a purge gas is provided, thereby production of a deposit on the inside surface of the incident side window is prevented from occurring and as a result, irregularly reflecting light is suppressed, so that weak scattered light from a fine particle in the process chamber can be measured.

Second Embodiment

Here is described a processing apparatus for fabricating LSI comprising a chamber to which an active gas is supplied for an intended processing, the apparatus further comprising an exhaust system in order to prevent deposition of a reaction product on the inside surface of the laser light guide-in window equipped to the chamber.

Figure 2:
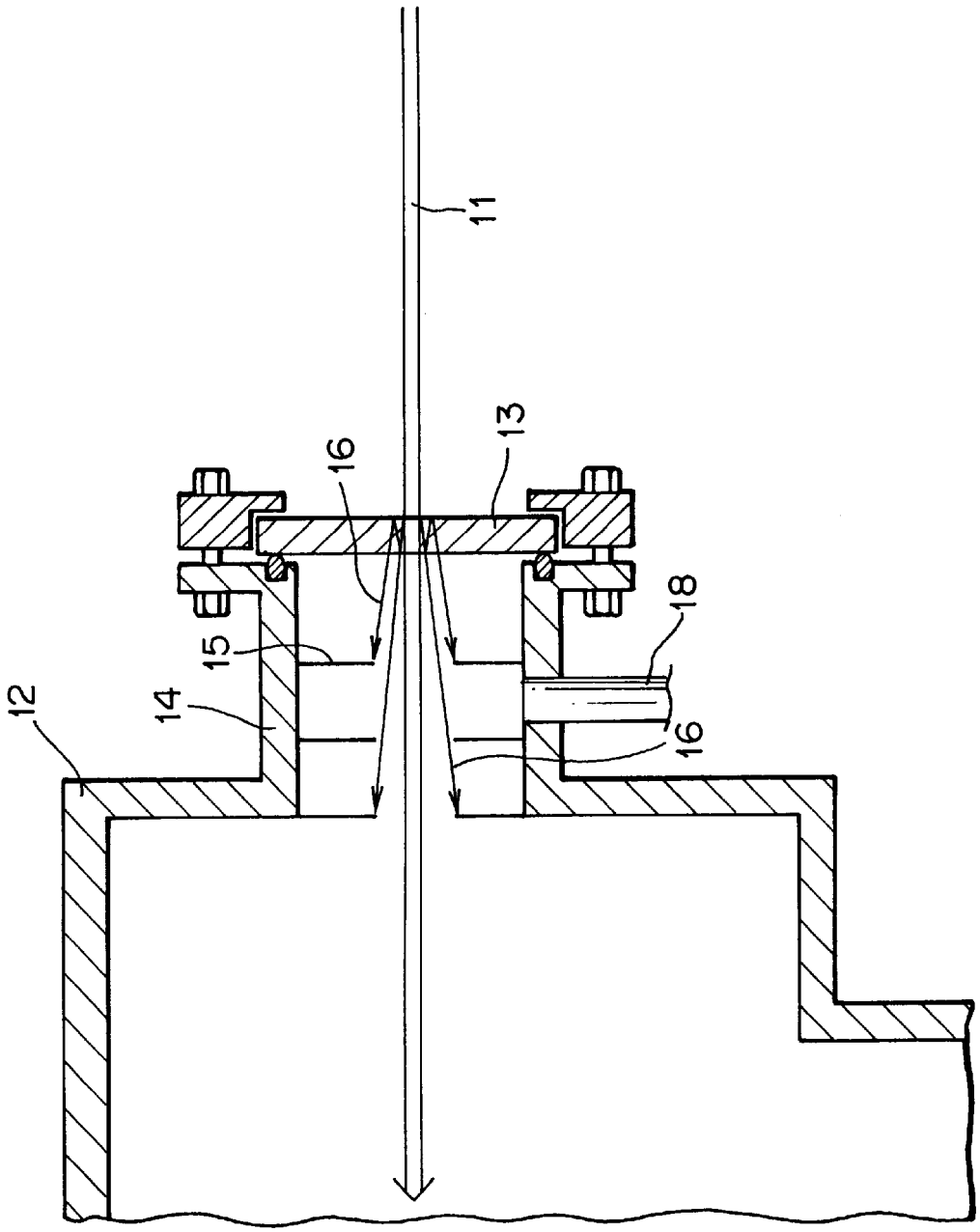
FIG. 2 is a partially sectional view showing a processing apparatus for fabricating LSI according to a second embodiment of the present invention.

FIG. 2 is a partially sectional view showing, in the best way, the second embodiment of a processing apparatus for fabricating LSI of the present invention. In this figure, the same parts as those of the first embodiment are indicated by the same marks.

In a processing apparatus for fabricating LSI of this embodiment, as shown in FIG. 2, another exhaust system 18 different from the exhaust system (not shown) of the process chamber 12 is provided to the protruding portion 14 of the process chamber 12 having a window 13 similar to the first embodiment. That is, this embodiment is of the same structure as that of the first embodiment with the exception that the second embodiment comprises the exhaust system 18 instead of the purge gas inlet port of the first embodiment.

In such an apparatus, since an opening of the chamber side of the protruding portion 14 is narrowed by the baffle 15 mounted in the protruding portion 14, a vacuum degree in the protruding portion 14 under suction of the exhaust system 18 is maintained higher than that in the process chamber 12. That is, differential exhaust can be realized by use of the exhaust system 18. While the active gas flows in the protruding portion 14 from the process chamber 12 by the differential exhaust, since the gas is exhausted before the gas reaches the window 13, deposition of the active gas on the inside surface of the window 13 is suppressed. An exhaust rate by the exhaust system 18 is determined by a predetermined pressure in the process chamber 12 and a gas flow rate flowing into the protruding portion 14.

Production of a deposit on the inside surface of the incident side window is prevented from occurring by providing such an exhaust system and as a result, since irregularly reflecting light, which is unnecessary, is suppressed, weak scattered light from a fine particle in the process chamber can be measured.

Third Embodiment

Here is described a processing apparatus for fabricating LSI comprising a chamber to which an active gas is supplied for an intended processing, the apparatus further comprising a shutter mechanism in order to prevent deposition of a reaction product on the inside surface of the laser light guide-in window equipped to the chamber.

Figure 3:
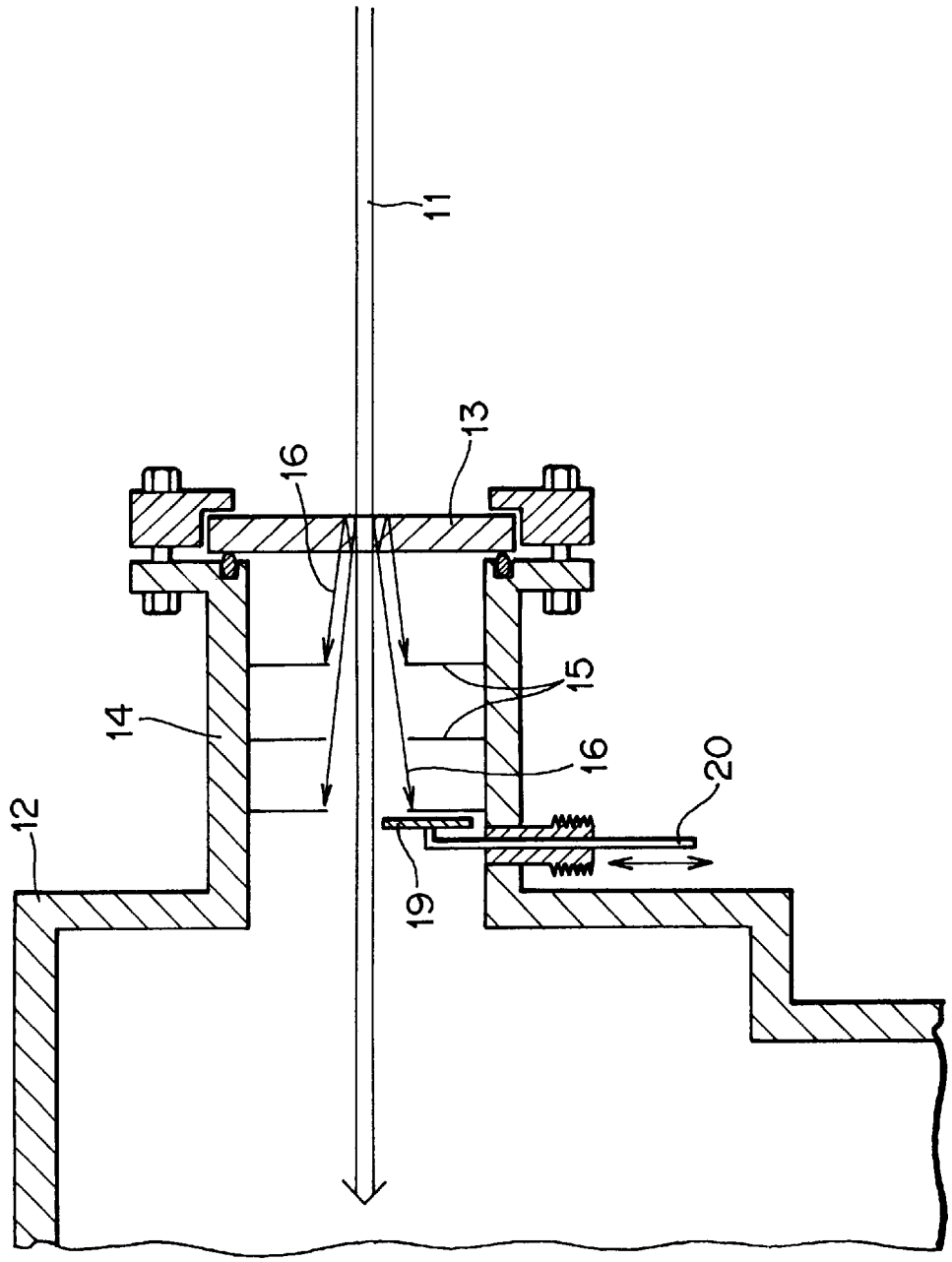
FIG. 3 is a partially sectional view showing a processing apparatus for fabricating LSI according to a third embodiment of the present invention.

FIG. 3 is a partially sectional view showing, in the a best way, the third embodiment of a processing apparatus for fabricating LSI of the present invention. In this figure, the same parts as those of the first embodiment are indicated by the same marks.

In a LSI fabrication apparatus of this embodiment, as shown in FIG. 3, a shutter 19 for closing laser light guide-in port, which is formed in the baffle 15, and which is a gas inlet port, is disposed in an optical path in the protruding portion 14 of the process chamber 12 provided with a window similar to that of the first embodiment. The shutter 19 is mounted to a linear motion guide-in piece 20 which extends outside the protruding portion 14 and is movable upward or downward of the figure. In such a manner, this embodiment comprises the shutter 19 and the linear motion guide-in piece 20 instead of the purge gas inlet port of the first embodiment.

In such an apparatus, the linear motion guide-in piece 20 is operated only when a occurrence state of a fine particle is detected and the shutter 19 which closes the laser light guide-in port of the baffle 15 is opened. Contrary to this, the shutter 19 is closed when the occurrence state is not detected. If the laser light guide-in port of the baffle 15 is closed by the shutter 19, an active gas does not intrude inside the baffle 15. A product is not deposited by a reaction on the inside surface of the window 13 when it is unnecessary if the shutter 19 is opened or closed in such a manner.

In the case where laser light 11 is a continuous light or can be regarded as a pseudo-continuous light with a repetition frequency of thousands of Hz, the shutter 19 is kept open during irradiation of the laser light 11. In the case of light with a frequency of the order of some Hz, the shutter 19 is opened or closed in synchronization with a timing of laser oscillation.

While in this embodiment, the linear motion guide-in piece 20 is used to move the shutter 19 vertically as viewed in the figure, it may be replaced by a rotary guide-in piece, wherein the shutter is rotated for opening or closing around an end of the rotary guide-in piece as a center. Still alternately, it may be adopted that a disc having a plurality of slits in an orderly manner along the periphery is rotated around its center by drive of a motor and a rotational speed of a motor is adjusted so as to be synchronized with the repetition frequency of the laser light.

With such a shutter mechanism provided, production of a deposit on the inside surface of the incident side window is reduced and as a result, irregularly reflecting light can be suppressed and thereby weak scattered light from a fine particle in the process chamber can be measured.

While in the first to third embodiments as described above, apparatuses in which a purge gas, local exhaust and a shutter are respectively used are taken as examples, if features of these apparatuses are combined in an arbitrary manner, deposition of a reaction product on the chamber inside surface of the incident side window can be more effectively prevented.

Fourth Embodiment

Here is described a processing apparatus for fabricating LSI comprising a chamber to which an active gas is supplied for an intended processing, the apparatus further comprising a gas passage structure for blowing out a purge gas on a damper which is a stopper of laser light guided in the chamber in order to prevent deposition of a reaction product on the surface of the damper.

Figure 4:
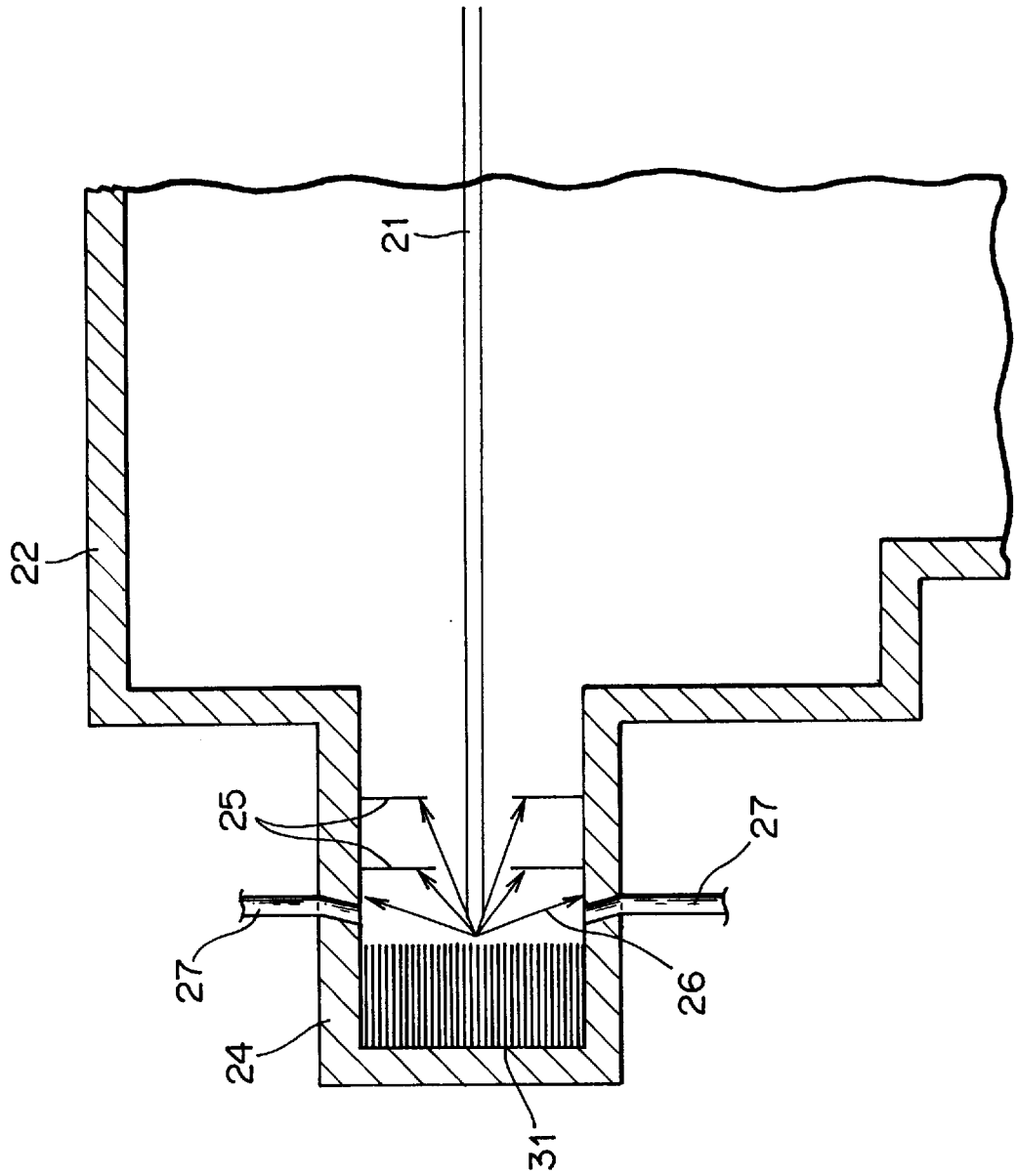
FIG. 4 is a partially sectional view s showing a processing apparatus for fabricating LSI according to a fourth embodiment of the present invention.

FIG. 4 is a partially sectional view showing, in the best way, the fourth embodiment of a processing apparatus for fabricating LSI of the present invention.

A processing apparatus for fabricating LSI of this embodiment, as shown in FIG. 4, comprises a process chamber 22 which is a chamber into which an active gas is supplied for an intended processing. A protruding portion 24 which is extended into the air is formed from the outer wall of the process chamber 22 at a position opposed to a position, where the incident side window through which laser light 21 is guided, of the outer wall of the process. A damper 31 which is a stopper of laser light 21 is disposed at the bottom of the protruding portion 24. The damper 31 is constituted of a bundle of black metal sheets each in the shape of a razor blade and the laser light 21 is subjected to multiple reflections in a repeated manner between blades so as to have the majority of the laser light 21 absorbed. A part of the incident laser light 21 to the damper 31 is returned to the processed chamber 22 as irregularly reflecting light 26. In order to suppress this, a baffle 25 is provided inside the protruding portion 24. A purge gas inlet port 27 for guiding the purge gas to the damper 31 is formed in the protruding portion 24. There is an effect that a quantity of returned irregularly reflecting light 26 in the process chamber 22 is decreased by the protruding portion 24.

In such an apparatus, there resides an active gas (for example oxygen gas and hydrogen gas) in the process chamber 22 and the active gas intrudes into the bottom side of the protruding portion 24 in which the damper 31 is located through a laser light guide-in port of the baffle 25. However, a purge gas such as chemically inert He gas is guided to the damper 31 from the purge gas guide-in port 27, thereby the purge gas is built up to occupy the space where the damper 31 is located and then of sucked into the process chamber 22 by an exhaust system (not shown) of the process chamber 22. For that reason, it is difficult for the active gas to reach the damper 31 and thus a product of a chemical reaction is prevented from deposition on the damper 31.

The purge gas may be any gas which does not react with a material of the damper and in addition to He, a rare gas such as Ar as a first of the kind or $N_2$ gas can be used. A flow rate of a purge gas is only required to be determined in consideration of a pressure in the process chamber, a partial pressure of an active gas and the like.

With such a mechanism for guiding-in a purge gas, production of a deposit on the damper can be prevented and as a result, irregularly reflecting light is suppressed, so that weak scattered light form a fine particle in the process chamber can be measured.

Fifth Embodiment

Here is described a processing apparatus for fabricating LSI comprising a chamber to which an active gas is supplied for an intended processing, the apparatus further comprising an exhaust system in order to prevent deposition of a reaction product on the damper which is a stopper of laser light guided in the chamber.

FIG. 5 is a partially sectional view showing, in the best way, the fifth embodiment of a processing apparatus for fabricating LSI of the present invention. In this figure, the same parts as those of the fourth embodiment are indicated by the same marks.

In a processing apparatus for fabricating LSI of this embodiment, as shown in FIG. 5, a different exhaust system 28 from the exhaust system (not shown) of the process chamber 22 is provided in the protruding portion 24 of the process chamber 22 equipped with a damper 31 similar to that of the fourth embodiment. That is, this embodiment is of the same construction as the fourth embodiment with the exception that the exhaust system 28 is provided instead of the purge gas guide-in port of the fourth embodiment.

In such an apparatus, an opening of the chamber side protruding portion 24 is narrowed by the baffle 25 mounted in the protruding portion 24 and thereby a vacuum degree in the protruding portion 24 by the exhaust system 28 is maintained higher than that of the process chamber 22. Thereby differential exhaust can be realized by use of the exhaust system 28. With the differential exhaust provided, while the active gas flows into the protruding portion 24 from the process chamber 22, the active gas is sucked away before it reaches the damper 31 and thus the active gas is prevented from deposition on the damper 31. An exhaust rate by the exhaust system 28 is determined by a predetermined pressure in the process chamber 22 and a gas flow rate flowing into the protruding portion 24.

With such an exhaust system provided, production of a deposit on the damper can be prevented and as a result, irregularly reflecting light is suppressed, so that weak scattered light form a fine particle in the process chamber can be measured.

Sixth Embodiment

Here is described a processing apparatus for fabricating LSI comprising a chamber to which an active gas is supplied for an intended processing, the apparatus further comprising a shutter mechanism in order to prevent deposition of a reaction product on the damper which is a stopper of laser light guided in the chamber.

FIG. 6 is a partially sectional view showing, in the best way, the sixth embodiment of a processing apparatus for fabricating LSI of the present invention. In this figure, the same parts as those of the fourth embodiment are indicated by the same marks.

In a LSI fabrication apparatus of this embodiment, as shown in FIG. 6, a shutter 29 for closing a laser light guide-in port, which formed in the baffle 25, and which is a gas inlet port, is disposed in an optical path in the protruding portion 24 of the process chamber 22 provided with the damper 31 similar to that of the fourth embodiment. The shutter 29 is mounted to a linear motion guide-in piece 30 which extends outside the protruding portion 24 and is movable upward or downward of the figure. In such a manner, this embodiment comprises the shutter 29 and the linear motion guide-in piece 30 instead of the purge gas inlet port of the fourth embodiment.

In such an apparatus, the linear motion guide-in piece 30 is operated only when a occurrence state of a fine particle is detected and the shutter 29 which closes the laser light guide-in port of the baffle 25 is opened. Contrary to this, the shutter 29 is closed when the occurrence state is not detected. If the laser light guide-in port of the baffle 25 is closed by the shutter 29, an active gas does not intrude inside the baffle 25. A product is not deposited by a reaction on the surface of the damper 31 when it is unnecessary if the shutter 29 is opened or closed in such a manner.

In the case where laser light 21 is a continuous light or can be regarded as a pseudo-continuous light with a repetition frequency of thousands of Hz, the shutter 29 is kept open during irradiation of the laser light 21. In the case of light with a lower frequency, the shutter 29 is opened or closed in synchronization with a timing of laser oscillation.

While in this embodiment, the linear motion guide-in piece 30 is used to move the shutter 29 vertically as viewed in the figure, it may be replaced by a rotary guide-in piece, wherein the shutter is rotated for opening or closing around an end of the rotary guide-in piece as a center. Still alternately, it may be adopted that a disc having a plurality of slits in an orderly manner along the periphery is rotated around its center by drive of a motor and a rotational speed of a motor is adjusted so as to be synchronized with the repetition frequency of the laser light.

With such a shutter mechanism provided, production of a deposit on the damper is reduced and as a result, irregularly reflecting light, can be suppressed and thereby weak scattered light from a fine particle in the process chamber can be measured.

While in the fourth to sixth embodiments as described above, apparatuses in which a purge gas, local exhaust and a shutter are respectively used are taken as examples, if features of these apparatuses are combined in an arbitrary manner, deposition of a reaction product on the damper can be more effectively prevented.

As a chemically active gas (process gas) used in a processing apparatus of the first to sixth embodiment as mentioned above, there can be named: a hydride, a halide, an organo metal compound or the like.

What is claimed is:

1. A processing apparatus for fabricating large scale integrated devices (LSI) comprising:

a process chamber adapted to be filled with a process gas for use in fabricating the LSI, to accept a laser light for sensing particles within said process chamber, and to be pressurized;

a process chamber exhaust system adapted for exhausting the process gas from said process chamber;

a beam damper mounted in a protruding portion of said process chamber, said beam damper having an interior volume and adapted to absorb the laser light entering into said beam damper; and a gas purging means for providing a purging gas, different from the process gas, which purging gas is chemically inert with respect to a material of said beam damper, said gas purging means being adapted to consider a pressure in said process chamber and in consideration of the pressure in said process chamber to provide the purging gas at a rate adjusted to cause the purging gas to occupy substantially all of said interior volume and to exclude the process gas from said interior volume of said beam damper, wherein the purging gas is exclusively exhausted from said interior volume by said process chamber exhaust system.

2. The processing apparatus of claim 1, further comprising a shutter to close and seal off an entrance of said beam damper to the process gas.

3. The processing apparatus of claim 2, further comprising a particle detector and wherein said shutter is operated to open said entrance when said particle detector detects a particle.

4. The processing apparatus of claim 2, wherein said shutter is adapted to open said entrance when said process chamber is accepting the laser light.

5. The processing apparatus of claim 2, wherein said shutter comprises a linear motion guide-in piece.

6. A processing apparatus for fabricating large scale integrated devices (LSI) comprising:

a process chamber adapted to be filled with a process gas for use in fabricating the LSI, to accept a laser light for sensing particles within said process chamber, and to be pressurized;

a process chamber exhaust system adapted for exhausting the process gas from said process chamber;

a beam damper for absorbing the laser light entering into said beam damper, said beam damper being mounted in a protruding portion of said process chamber, said beam damper having an entrance open to said process chamber, an interior volume, and a light absorbing portion located opposite the entrance; and a beam damper gas exhaust port positioned intermediate said entrance and said light absorbing portion for exhausting the process gas, said exhaust port being adapted to create a low pressure region within said interior volume, said low pressure region being adjusted to cause any of the process gas entering the interior volume to be exhausted via said exhaust port without first contacting said light absorbing portion.

7. The processing apparatus of claim 6, further comprising a shutter to close off an entrance of said beam damper to the process gas.

8. The processing apparatus of claim 7, further comprising a particle detector and wherein said shutter is operated to open said entrance when said particle detector detects a particle.

9. The processing apparatus of claim 7, wherein said shutter is adapted to open said entrance when said process chamber is accepting the laser light.

10. The processing apparatus of claim 7, wherein said shutter comprises a linear motion guide-in piece.

11. A processing apparatus for fabricating large scale integrated devices (LSI) comprising:

a process chamber adapted to be filled with a process gas for use in fabricating the LSI, to accept a laser light for sensing particles within the process chamber, and to be pressurized;

a process chamber exhaust system adapted for exhausting the process gas from said process chamber;

a beam damper for absorbing the laser light entering into said beam damper, said beam damper being mounted in a protruding portion of said process chamber, said beam damper having an entrance open to said process chamber, an interior volume, and a light absorbing portion located opposite the entrance; and a shutter to close off said entrance of said beam damper to the process gas so that the process gas is excluded from said interior volume.

12. The processing apparatus of claim 11, further comprising a particle detector and wherein said shutter is operated to open said entrance when said particle detector detects a particle.

13. The processing apparatus of claim 11, wherein said shutter is adapted to open off said entrance when said process chamber is accepting the laser light.

14. The processing apparatus of claim 11, wherein said shutter comprises a linear motion guide-in piece.

15. The processing apparatus of claim 11, further comprising a beam damper gas exhaust port positioned intermediate said entrance and said light absorbing portion for exhausting the process gas, said exhaust port being adapted to create a low pressure region within said interior volume, said low pressure region being adjusted to cause any of the process gas entering the interior volume to be exhausted via said exhaust port without first contacting said light absorbing portion.

16. The processing apparatus of claim 11, further comprising a gas purging port for providing a purging gas, different from the process gas, which purging gas is chemically inert with respect to a material of said beam damper, said gas purging port being adapted to consider a pressure in said process chamber and in consideration of the pressure in said process chamber to provide the purging gas at a rate adjusted to cause the purging gas to occupy substantially all of said interior volume to the exclusion of the process gas.

* * * * *